United States Patent
Chen et al.

(10) Patent No.: US 8,304,838 B1
(45) Date of Patent: Nov. 6, 2012

(54) ELECTROSTATIC DISCHARGE PROTECTION DEVICE STRUCTURE

(75) Inventors: Zi-Ping Chen, New Taipei (TW); Tung-Yang Chen, Jhubei (TW); Kun-Hsien Lin, Hsinchu (TW); Ryan Hsin-Chin Jiang, Taipei (TW)

(73) Assignee: Amazing Microelectronics Corp., New Taipei (TW)

( * ) Notice: Subject to any disclaimer, the term of this patent is extended or adjusted under 35 U.S.C. 154(b) by 0 days.

(21) Appl. No.: 13/216,016

(22) Filed: Aug. 23, 2011

(51) Int. Cl.
*H01L 21/00* (2006.01)

(52) U.S. Cl. ............... 257/370; 257/355; 361/56

(58) Field of Classification Search ............. 257/370, 257/355; 361/56
See application file for complete search history.

(56) References Cited

U.S. PATENT DOCUMENTS

| | | | |
|---|---|---|---|
| 6,617,650 B1* | 9/2003 | Chen et al. | 257/355 |
| 6,747,861 B2* | 6/2004 | Ker et al. | 361/111 |
| 6,815,775 B2* | 11/2004 | Ker et al. | 257/355 |
| 6,972,476 B2* | 12/2005 | Chen et al. | 257/547 |
| 7,304,827 B2* | 12/2007 | Chen et al. | 361/56 |
| 7,525,779 B2* | 4/2009 | Chen et al. | 361/56 |
| 7,696,580 B2* | 4/2010 | Chen et al. | 257/370 |
| 7,710,695 B2* | 5/2010 | Chen | 361/56 |
| 7,719,805 B2* | 5/2010 | Lai | 361/56 |
| RE43,215 E * | 2/2012 | Ker et al. | 257/355 |
| 8,217,457 B1* | 7/2012 | Sengupta et al. | 257/355 |
| 8,237,193 B2* | 8/2012 | Chuang et al. | 257/173 |
| 2002/0149059 A1* | 10/2002 | Ker et al. | 257/355 |
| 2003/0090845 A1* | 5/2003 | Ker et al. | 361/56 |
| 2004/0218322 A1* | 11/2004 | Chen et al. | 361/56 |
| 2006/0044719 A1* | 3/2006 | Chen et al. | 361/56 |
| 2007/0073807 A1* | 3/2007 | Bobde | 709/203 |
| 2008/0128816 A1* | 6/2008 | Lai | 257/355 |
| 2008/0297960 A1* | 12/2008 | Chen | 361/56 |
| 2009/0040668 A1* | 2/2009 | Chen et al. | 361/56 |
| 2010/0044834 A1* | 2/2010 | Park et al. | 257/572 |

FOREIGN PATENT DOCUMENTS

| | | |
|---|---|---|
| TW | 480701 | 3/2002 |
| TW | I245405 | 12/2005 |
| TW | I248193 | 1/2006 |

OTHER PUBLICATIONS

Ker, et al., "Design on the Low-Leakage Diode String for Using in the Power-Rail ESD Clamp Circuits in a 0.35- μm Silicide CMOS Process" vol. 35, No. 4, (2009) p. 601.

* cited by examiner

*Primary Examiner* — Laura Menz
(74) *Attorney, Agent, or Firm* — Muncy, Geissler, Olds & Lowe, PLLC

(57) ABSTRACT

An electrostatic discharge protection device structure is disclosed, which comprises a semiconductor substrate and an N-type epitaxial layer arranged on the semiconductor substrate. At least one snapback cascade structure is arranged in the N-type epitaxial layer, wherein the snapback cascade structure further comprises first and second P-type wells arranged in the N-type epitaxial layer. First and second heavily doped areas arranged in the first P-type well respectively belong to opposite types. And, third and fourth heavily doped areas arranged in the second P-type well respectively belong to opposite types, wherein the second and third heavily doped areas respectively belong to opposite types and are electrically connected with each other. When the first heavily doped area receives an ESD signal, an ESD current flows from the first heavily doped area to the fourth heavily doped area through the first P-type well, the N-type epitaxial layer, and the second P-type well.

6 Claims, 7 Drawing Sheets

ELECTROSTATIC DISCHARGE PROTECTION DEVICE STRUCTURE

BACKGROUND OF THE INVENTION

1. Field of the Invention

The present invention relates to a protection device structure, particularly to an electrostatic discharge protection device structure.

2. Description of the Related Art

A diode having a simple structure is usually used as an ESD (Electrostatic Discharge) protection device in an IC. The traditional diode ESD protection circuit is shown in FIG. 1. As to the ESD protection circuit, the more the cascaded diodes 10 are, the larger the substrate leakage current is. A parasitic PNP BJT constructed by the P+/NW diode and the P-type substrate induces the substrate leakage current. When the diodes cascaded, the PNP BJTs forms the Darlington Circuit. The more the cascaded diodes, the higher the gain of the Darlington Circuit is, and the larger the substrate leakage current is.

In order to the above-mentioned problems, The U.S. Pat. No. 6,617,650, the U.S. Pat. No. 6,972,476 and the U.S. Pat. No. 7,696,580 provide methods for improving a diode structure, which solve the problem that the substrate leakage current is induced in using the ESD protection circuit consisting of traditional diodes. However, the traditional P+/NW diode and the ESD protection circuits of the three US patents have the same disadvantage. The more the diodes of the ESD protection circuit are, the larger the impedance of discharging paths provided by the ESD protection circuit is. The ESD current no more flows to the ground terminal via the discharging paths, but flows to the ground terminal via low impedance paths of the IC. The phenomena easily results in that internal circuits of the IC is broken due to the ESD current. FIG. 2 shows an I-V curve of a TLP (Transmission Line Pulsing System) of the diode ESD protection circuit. From FIG. 2, the more the cascaded diodes are, the larger the turn-on resistance is. In other words, under the high current condition, the ESD protection circuit consisting of more diodes has a higher clamping voltage and the worse efficiency for protecting the internal circuits of the IC.

To overcome the abovementioned problems, the present invention provides an electrostatic discharge protection device structure, so as to solve the afore-mentioned problems of the prior art.

SUMMARY OF THE INVENTION

A primary objective of the present invention is to provide an electrostatic discharge (ESD) protection device structure, which uses at least one snapback cascade structure to provide a lower turn-on voltage and a very low holding voltage. When an ESD protection circuit is constructed by the cascaded ESD protection device structure that can provide an ESD discharging path with low impedance, the ESD protection circuit efficiently clamps the ESD voltage to below the breakdown voltage of the PN junction (or MOS gate oxide) lest internal circuits of an IC have abnormal function or be broken.

To achieve the abovementioned objectives, the present invention provides an electrostatic discharge protection device structure, which comprises a semiconductor substrate and an N-type epitaxial layer arranged on the semiconductor substrate. At least one snapback cascade structure is arranged in the N-type epitaxial layer, wherein the snapback cascade structure further comprises first and second P-type wells arranged in the N-type epitaxial layer. A first heavily doped area and a second heavily doped area are arranged in the first P-type well, wherein the first heavily doped area and the second heavily doped area respectively belong to opposite types. And, a third heavily doped area and a fourth heavily doped area are arranged in the second P-type well, wherein the third heavily doped area and the fourth heavily doped area respectively belong to opposite types, and wherein the second heavily doped area and the third heavily doped area respectively belong to opposite types and are electrically connected with each other. When the first heavily doped area receives an ESD signal, an ESD current flows from the first heavily doped area to the fourth heavily doped area through the first P-type well, the N-type epitaxial layer, and the second P-type well.

Below, the embodiments are described in detail in cooperation with the drawings to make easily understood the technical contents, characteristics and accomplishments of the present invention.

DETAILED DESCRIPTION OF THE INVENTION

Figure 1:
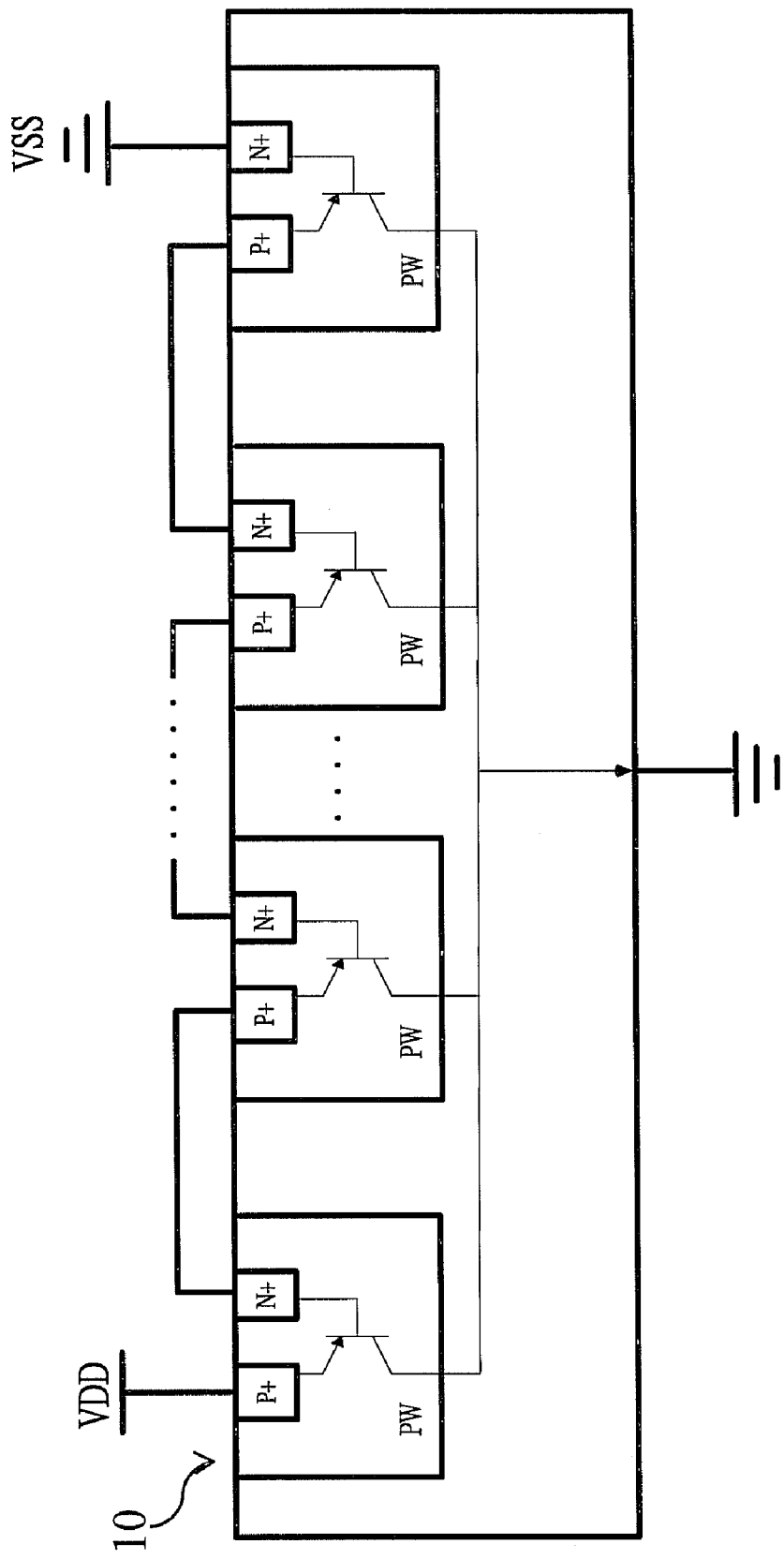
FIG. 1 is a circuit diagram showing an electrostatic discharge (ESD) protection circuit according to the prior art.
Figure 2:
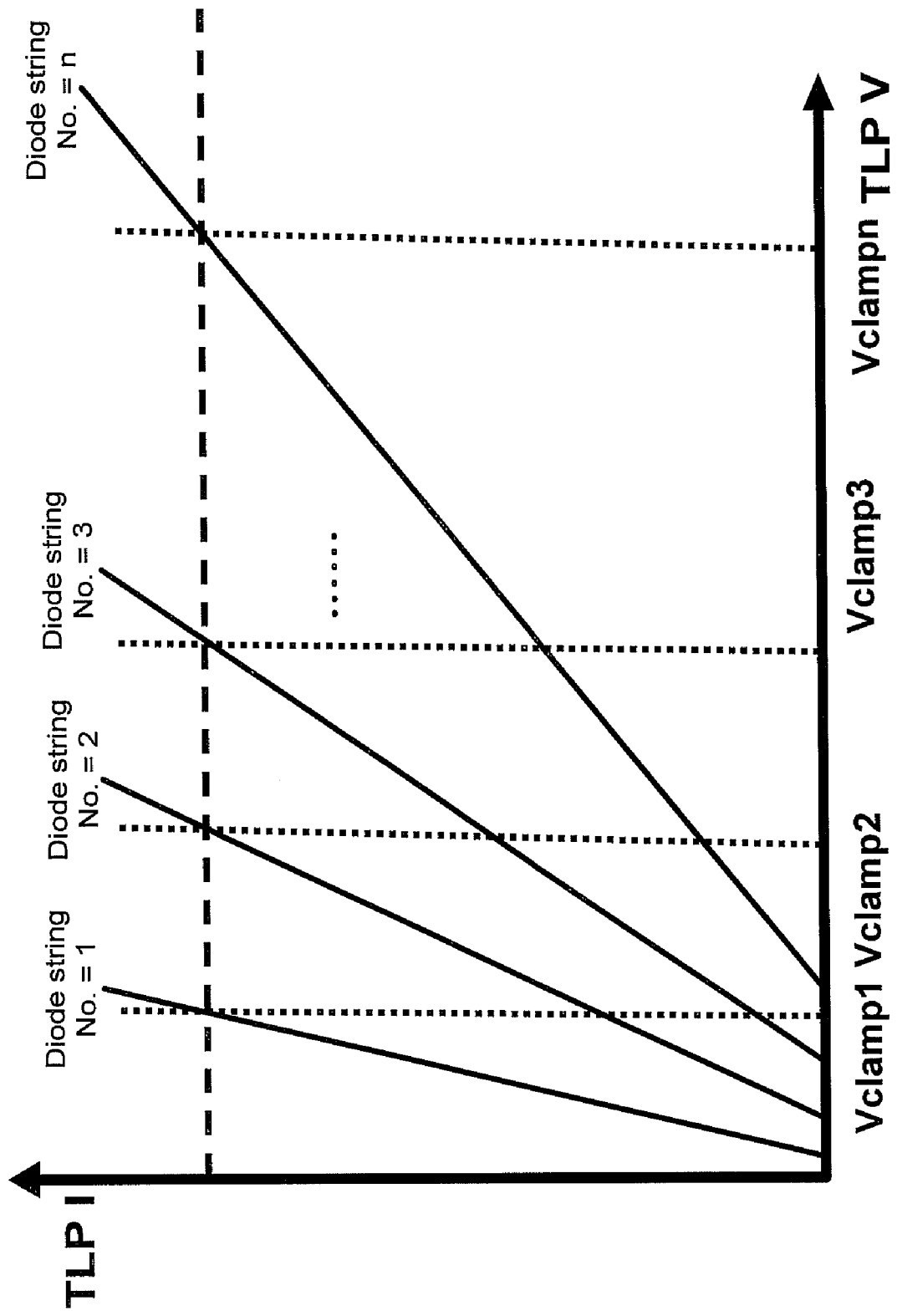
FIG. 2 is a diagram showing a TLP (Transmission Line Pulsing System) I-V curve of the ESD protection circuit according to the prior art.
Figure 3:
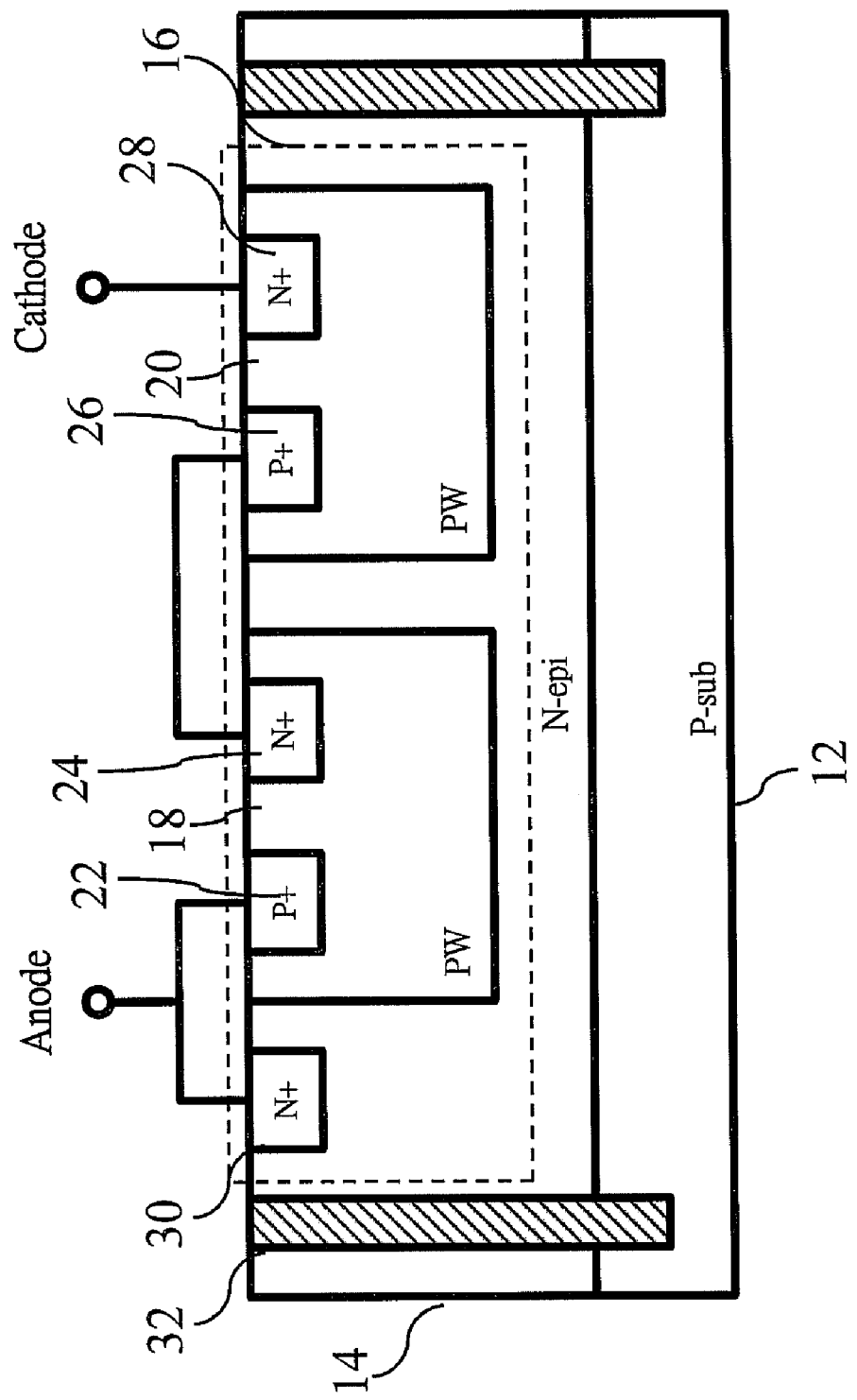
FIG. 3 is a sectional view schematically showing an ESD protection device structure according to an embodiment of the present invention.

Refer to FIG. 3. An electrostatic discharge (ESD) protection device structure of the present invention comprises a P-type substrate used as a semiconductor substrate 12. An N-type epitaxial layer 14 is arranged on the semiconductor substrate 12, and at least one snapback cascade structure 16 is arranged in the N-type epitaxial layer 12. In the embodiment, the number of the snapback cascade structure 16 is one, which is used as an example. The snapback cascade structure 16 comprises a first P-type well 18 and a second P-type well 20 arranged in the N-type epitaxial layer 14, wherein a first heavily doped area 22 and a second heavily doped area 24 are arranged in the first P-type well 18, and wherein a third heavily doped area 26 and a fourth heavily doped area 28 are arranged in the second P-type well 20. The first and second heavily doped areas 22 and 24 respectively belong to opposite types, the third and fourth heavily doped areas 26 and 28 respectively belong to opposite types, and the second and third heavily doped areas 24 and 26 respectively belong to opposite types and are electrically connected by a metal wire. As a result, in the embodiment, a P-type heavily doped area is respectively used as the first and third heavily doped areas 22 and 26, and an N-type heavily doped area is respectively used as the second and fourth heavily doped areas 24 and 28. Additionally, the snapback cascade structure 16 further comprises an N-type heavily doped area 30 arranged in the N-type epitaxial layer 14 and electrically connected with the first heavily doped area 22 and an anode by a metal wire. The fourth heavily doped area 28 is also connected with a cathode by a metal wire. There is at least one deep isolation trench 32 arranged in the N-type epitaxial layer 14. The deep isolation trench 32 has a depth greater than a depth of the N-type epitaxial layer 14 and surrounds the N-type heavily doped area 30, the first P-type well 18 and the second P-type well 20.

Figure 4:
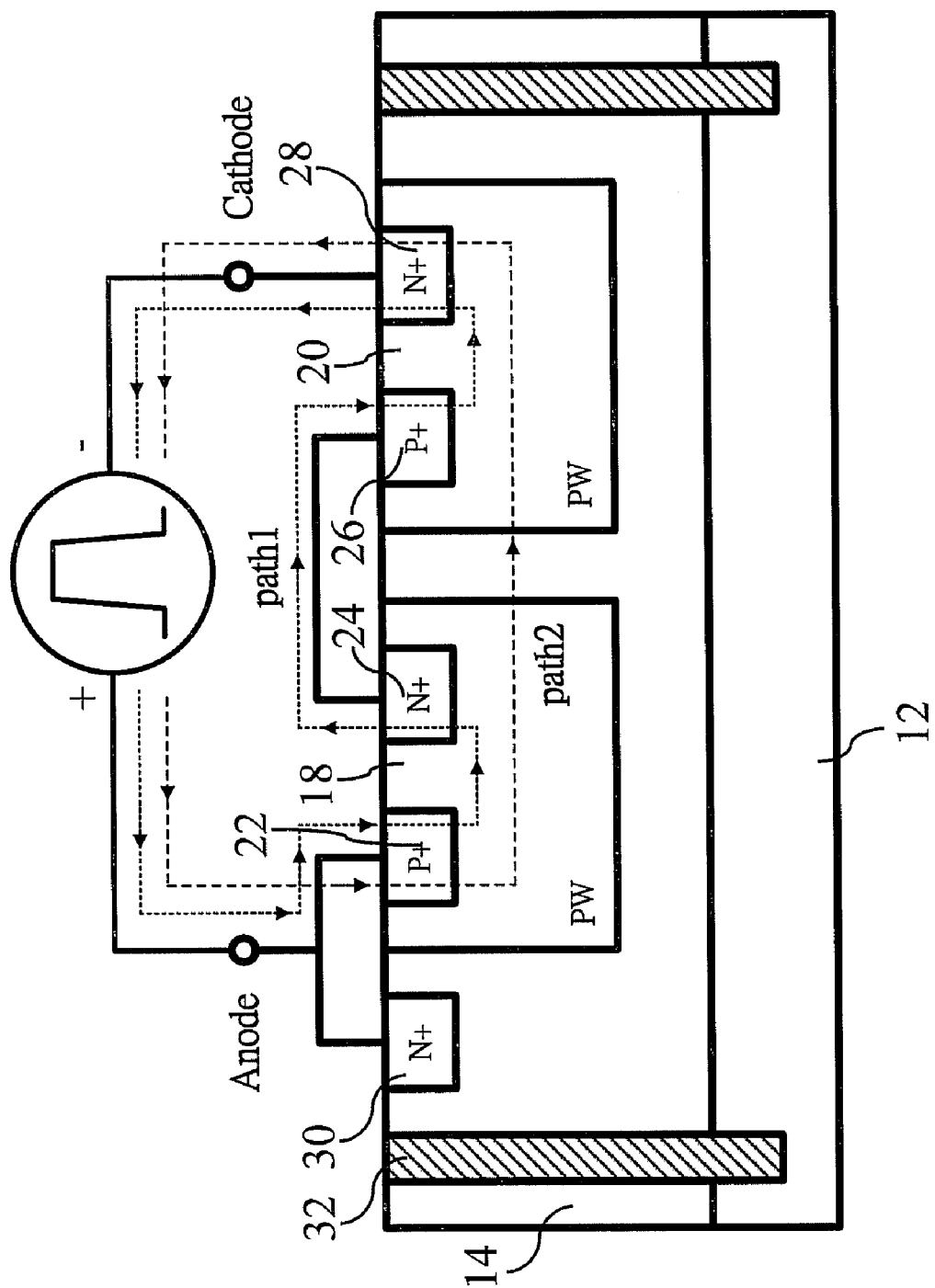
FIG. 4 is a sectional view schematically showing the ESD protection device structure with ESD discharging paths according to an embodiment of the present invention.

Refer to FIG. 4. When the voltage signal of the anode is less than the double diode cut-in voltage, the ESD protection device structure is turned off. When the voltage signal of the anode is larger than the double diode cut-in voltage, the ESD protection device structure is turned on. At this time, the current flows from the first heavily doped area 22 to the fourth heavily doped area 28 through the first P-type well 18, the second heavily doped area 24, the third heavily doped area 26, and the second P-type well 20, as shown by path 1. When a voltage signal or a current signal with higher energy, such as an ESD signal, appears at the anode, the first heavily doped area 22 receives the ESD signal, whereby the ESD current flows from the first heavily doped area 22 to the fourth heavily doped area 28 through the first P-type well 18, the N-type epitaxial layer 14, and the second P-type well 20, as shown by path 1. At this time, the turn-on current flows from the first heavily doped area 22 to the fourth heavily doped area 28 through the first P-type well 18, the second heavily doped area 24, the third heavily doped area 26, and the second P-type well 20, as shown by path 2. Path 2 has low impedance to discharge the high energy current from the anode to the cathode, so that the voltage of the anode is clamped to a low voltage (about 1 volt).

Figure 5:
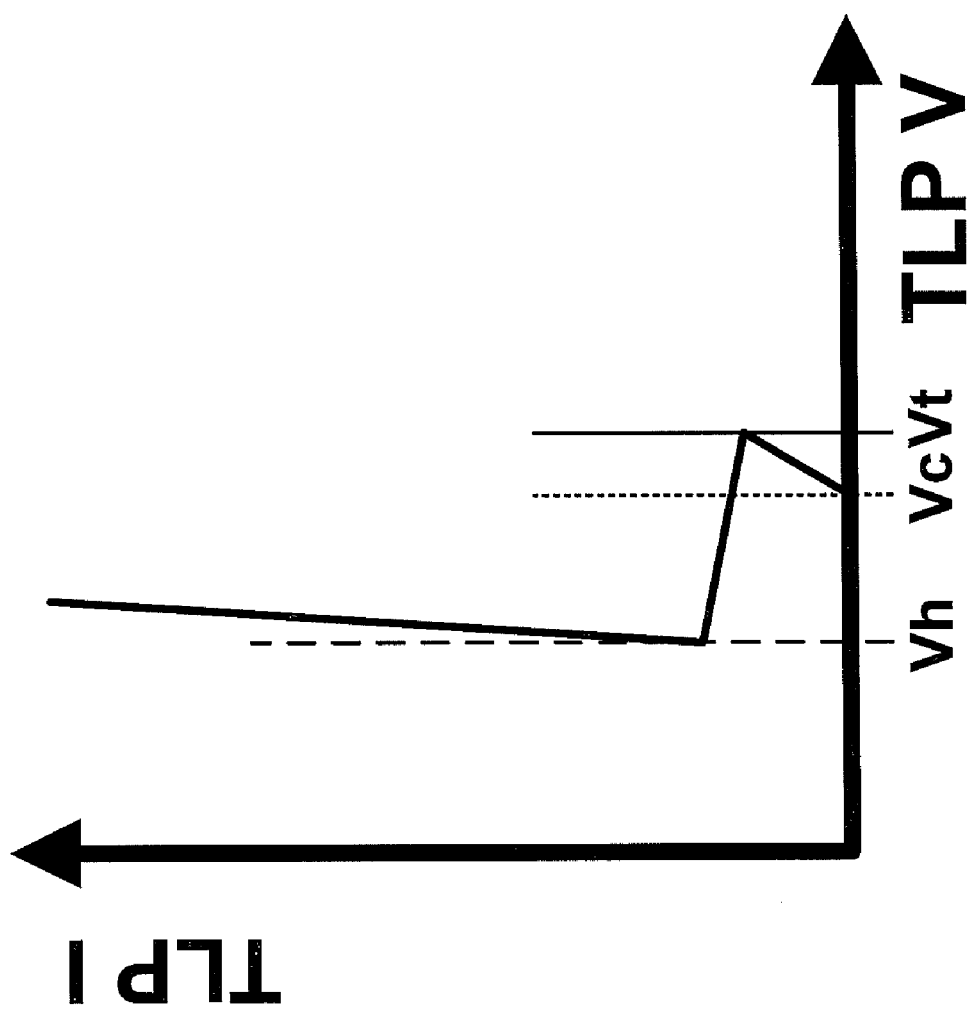
FIG. 5 is a diagram showing a TLP I-V curve of the ESD protection device structure.

Refer to FIG. 4 and FIG. 5. When the voltage of the anode is lightly larger than the double diode cut-in voltage Vc used as a turn-on voltage, the current flows from the anode to the cathode via path 1. When the voltage of the anode is raised to Vt, path 2 is build and the snapback phenomena occurs, so that a holding voltage of the ESD protection device structure descends to about 1 volt. In other words, the ESD protection device structure operates at a low voltage under high current operation due to the ultra low impedance of path 2.

Figure 6:
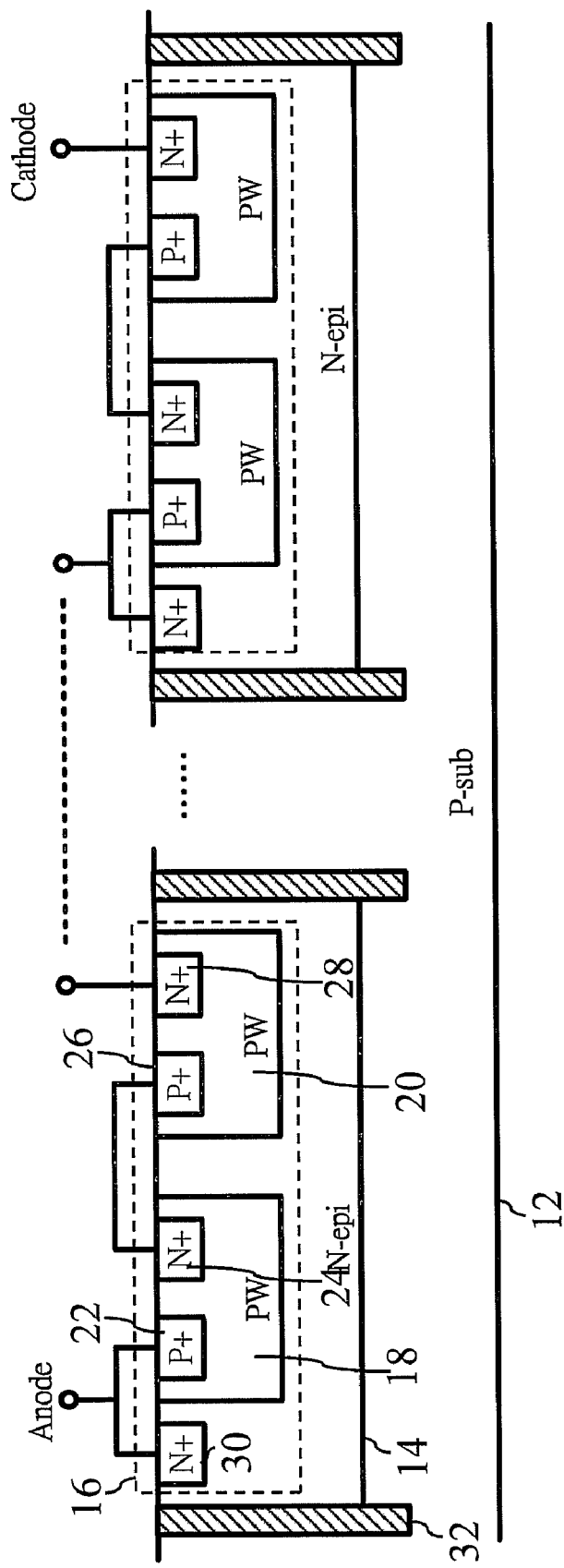
FIG. 6 is a sectional view schematically showing an ESD protection circuit according to an embodiment of the present invention.

Refer to FIG. 6. FIG. 6 is a sectional view schematically showing an ESD protection circuit. The ESD protection circuit is different from the ESD protection device structure in that the ESD protection circuit comprises a plurality of snapback cascade structures 16, wherein the snapback cascade structure 16 is cascaded to the next snapback cascade structure 16 via connecting the fourth and first heavily doped areas 28 and 22. The deep isolation trench 32 separates each snapback cascade structure 16. The ESD protection circuit clamps the voltage of the anode to a low voltage under high current operation. The ESD protection circuit designed by the cascaded way can avoid false triggering for noise and affecting the normal operation of an IC.

Figure 7:
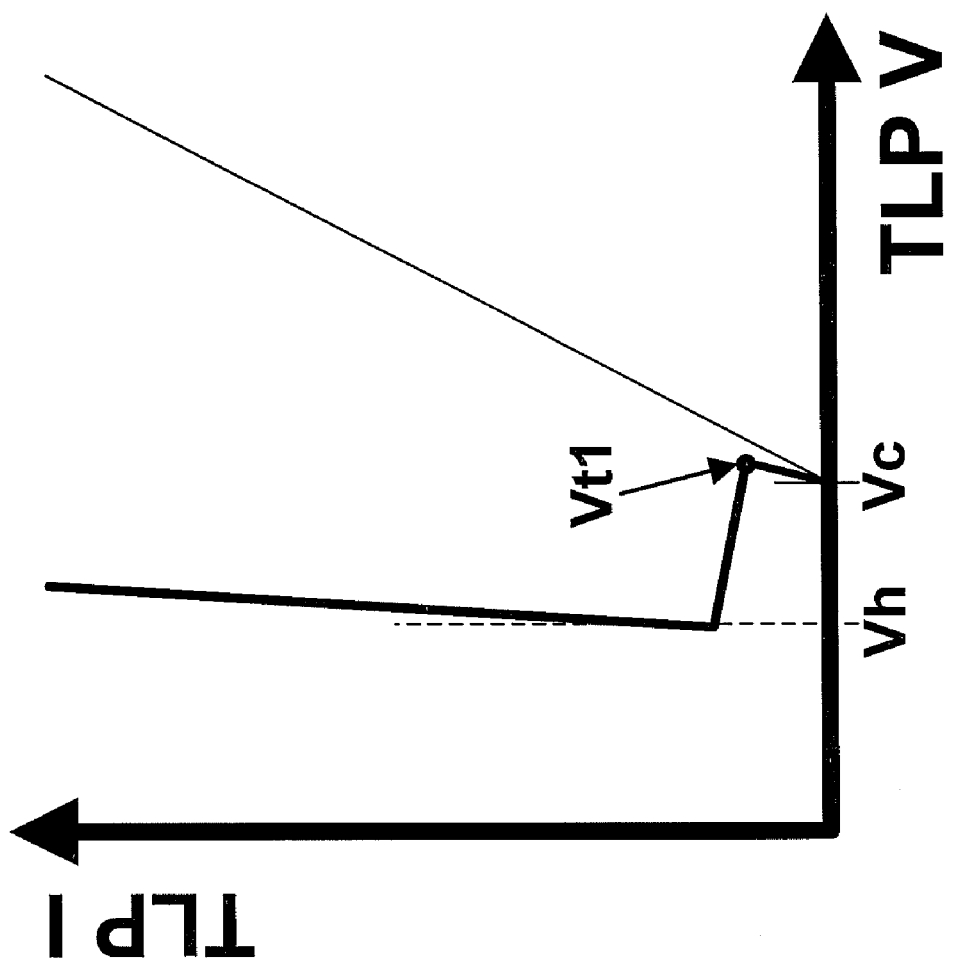
FIG. 7 is a diagram showing TLP I-V curves of the ESD protection circuit consisting of the two cascaded snapback cascade structures and four cascaded diodes.

When the ESD protection circuit applies to 1.8 V power, the two cascaded snapback cascade structures or four diodes are required. As shown in FIG. 7, the thick line denotes the protection circuit formed by the two cascaded snapback cascade structures, and the thin line denotes the protection circuit formed by the four diodes. The two protection circuits are turned on at a voltage Vc of 2.4V. For the protection circuit formed by the diodes, the higher the ESD current is, the higher the clamp voltage is. When the protection circuit formed by the two snapback cascade structures operates at Vt1, the snapback phenomena of the snapback cascade structure occurs, and then the protection circuit clamps the operation voltage to a voltage Vh of 2V. In other words, the clamping voltage of the protection circuit of the present invention is greatly lower than that of the protection circuit formed by the cascaded diodes. Therefore, the ESD protection circuit constructed by the snapback cascade structures efficiently clamps the ESD voltage to below the breakdown voltage of the PN junction (or MOS gate oxide) lest internal circuits of the IC have abnormal function or be broken.

In conclusion, the present invention adopts the snapback cascade structure to provide the lower turn-on voltage and the very low holding voltage, such that the internal circuits of the IC are protected.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A electrostatic discharge (ESD) protection device structure, comprising:
   a semiconductor substrate;
   an N-type epitaxial layer arranged on said semiconductor substrate; and
   at least one snapback cascade structure arranged in said N-type epitaxial layer, wherein said snapback cascade structure further comprises:
   a first P-type well arranged in said N-type epitaxial layer, wherein a first heavily doped area and a second heavily doped area are arranged in said first P-type well, and wherein said first heavily doped area and said second heavily doped area respectively belong to opposite types; and
   a second P-type well arranged in said N-type epitaxial layer, wherein a third heavily doped area and a fourth heavily doped area are arranged in said second P-type well, and wherein said third heavily doped area and said fourth heavily doped area respectively belong to opposite types, and wherein said second heavily doped area and said third heavily doped area respectively belong to opposite types and are electrically connected with each other, wherein when said first heavily doped area receives an ESD signal, an ESD current flows from said first heavily doped area to said fourth heavily doped area through said first P-type well, said N-type epitaxial layer, and said second P-type well.

2. The electrostatic discharge protection device structure according to claim 1, wherein when said first heavily doped area receives said ESD signal, a turn-on current flows from said first heavily doped area to said fourth heavily doped area through said first P-type well, said second heavily doped area, said third heavily doped area, and said second P-type well.

3. The electrostatic discharge protection device structure according to claim 1, further comprising at least one deep isolation trench arranged in said N-type epitaxial layer, having a depth greater than a depth of said N-type epitaxial layer, and surrounding said first P-type well and said second P-type well.

4. The electrostatic discharge protection device structure according to claim 1, wherein said snapback cascade structure further comprises an N-type heavily doped area arranged in said N-type epitaxial layer and electrically connected with said first heavily doped area.

5. The electrostatic discharge protection device structure according to claim 1, wherein said first and third heavily doped areas are P-type heavily doped areas, said second and fourth heavily doped areas are N-type heavily doped areas.

6. The electrostatic discharge protection device structure according to claim 1, wherein said semiconductor substrate is a P-type substrate.

* * * * *